United States Patent
Ochiai

[11] Patent Number: 5,959,346
[45] Date of Patent: Sep. 28, 1999

[54] METHOD FOR FABRICATING METAL BUMPS ONTO ELECTRONIC DEVICE

[75] Inventor: Masayuki Ochiai, Kawasaki, Japan

[73] Assignee: Fujitsu Limited, Kanagawa, Japan

[21] Appl. No.: 08/917,473

[22] Filed: Aug. 26, 1997

[30] Foreign Application Priority Data

Nov. 11, 1996 [JP] Japan .................................. 8-298693

[51] Int. Cl.$^6$ .............................................. H01L 21/441
[52] U.S. Cl. ...................... 257/618; 438/613; 438/614; 438/615; 438/616
[58] Field of Search .................... 438/613, 614, 438/615, 616; 257/618, 627

[56] References Cited

U.S. PATENT DOCUMENTS

| | | |
|---|---|---|
| 3,458,925 | 8/1969 | Napier et al. . |
| 5,135,606 | 8/1992 | Kato et al. . |
| 5,136,363 | 8/1992 | Endo et al. . |
| 5,145,552 | 9/1992 | Yoshizawa et al. . |
| 5,208,186 | 5/1993 | Matthew . |
| 5,381,848 | 1/1995 | Trabucco . |
| 5,607,099 | 3/1997 | Yeh et al. . |
| 5,643,831 | 7/1997 | Ochiai et al. . |

FOREIGN PATENT DOCUMENTS

| | | |
|---|---|---|
| 242 908 | 2/1987 | Germany . |
| 53-3980 | 2/1978 | Japan . |
| 62-25435 | 2/1987 | Japan . |
| 63-289824 | 11/1988 | Japan . |
| 1-308037 | 12/1989 | Japan . |
| 4-14834 | 1/1992 | Japan . |
| 4-263433 | 9/1992 | Japan . |
| 4-263434 | 9/1992 | Japan . |
| 4-264731 | 9/1992 | Japan . |
| 6-124953 | 5/1994 | Japan . |

*Primary Examiner*—Caridad Everhart
*Attorney, Agent, or Firm*—Armstrong, Westerman, Hattori, McLeland & Naughton

[57] ABSTRACT

A plate used for fabricating metal bumps is made from a silicon having a <110> crystallographic plane. The plate has a flat surface arranged at an angle relative to the <110> crystallographic plane, and cavities are formed in the flat surface by anisotropic etching. Each of the cavities has a rhombic opening and two oblique bottom surfaces defining a deepest portion. The deepest portion is shorter than the diagonal line of the rhombus and positioned in the cavity near one end thereof. In the method for fabricating metal balls, the cavities are filled with a paste containing metal particles, and heated to form metal balls in the cavities. The metal balls are then transferred from the plate to an electronic device.

12 Claims, 8 Drawing Sheets

METHOD FOR FABRICATING METAL BUMPS ONTO ELECTRONIC DEVICE

BACKGROUND OF THE INVENTION

1. Field of the Invention

The present invention relates to a method for fabricating metal bumps onto an electronic device such as an LSI wafer, a chip scale package (CSP), a ball grid array (BGA), and a tape carrier package (TCP), and a plate used for fabricating the metal bumps.

2. Description of the Related Art

Recently, high-density mounting of semiconductor devices has been developed for the purpose of miniaturization and weight-reduction of electronic devices including ICs and LSIs, so that the electronic devices have several hundred input/output terminals (electrodes). In a known method for mounting an electronic device having many terminals to a printed circuit board, metal bumps are formed onto a surface of a semicounductor chip (or semicounductor package), and the semicounductor chip is then attached to the printed circuit board via the metal bumps.

A method for mounting metal bumps onto a CSP or a BGA is disclosed in the U.S. Pat. Ser. No. 08/516,284 and Japanese Unexamined Patent Publication (Kokai) No. 7-249631 (entitled a method for fabricating solder bumps and solder balls and a method for fabricating a semiconductor device). This publication discloses a method for forming solder bumps comprising the steps of forming cavities in a solder ball forming plate, filling the cavities with solder paste, and heating the solder ball forming plate to form solder balls in the cavities. After the solder ball forming plate is arranged relative to an electronic device so that the solder balls are aligned with the electrode pads of the electronic device, a reflow step is carried out to transfer the solder balls from the solder ball forming plate to the electrode pads of the electronic device.

Figure 10:
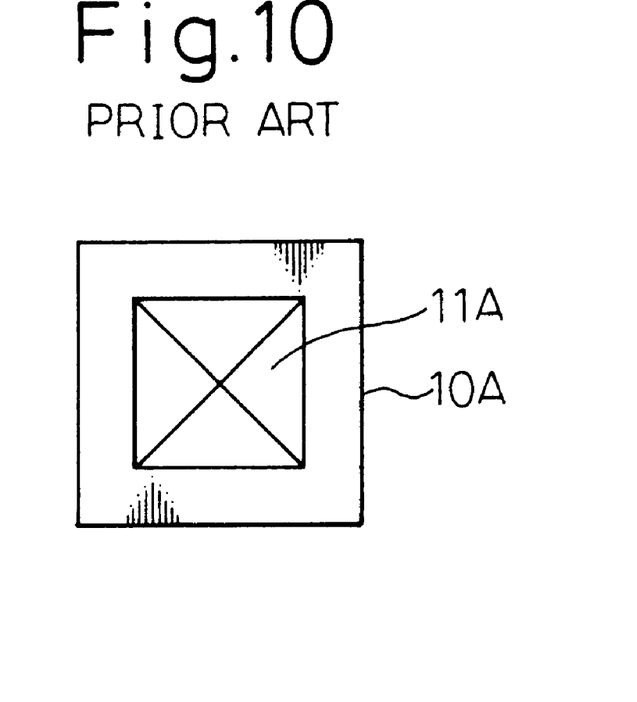
FIG. 10 is a plan view of a solder ball forming plate of a prior art.
Figure 11:
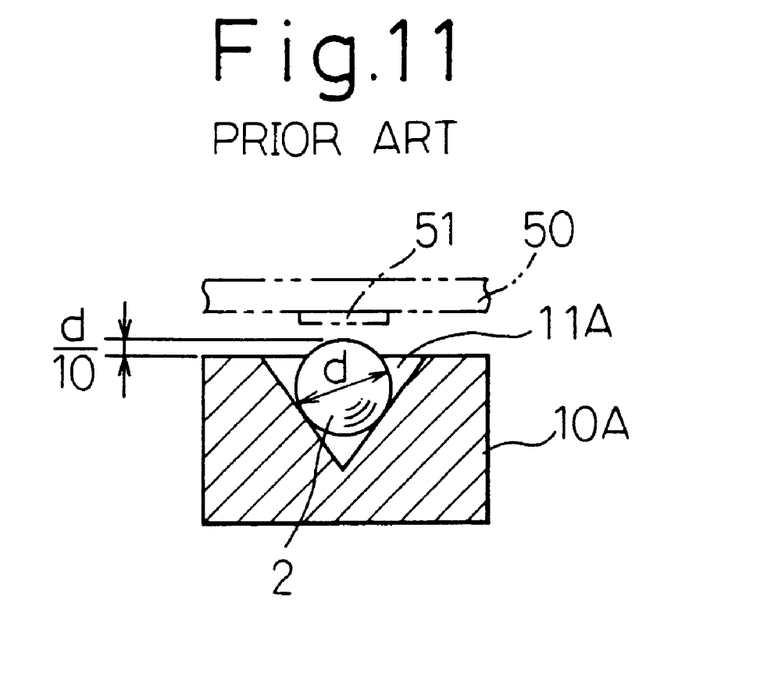
FIG. 11 is a cross-sectional view of the solder ball forming plate of FIG. 10.

FIGS. 10 and 11 of the attached drawings illustrate the solder ball forming plate 10A which is similar to the solder ball forming plate described in the above described publication. The solder ball forming plate 10A has a flat surface and a plurality of cavities 11A (only one is shown in the drawings) arranged in the flat surface thereof. The solder ball forming plate 10A is made from a silicon wafer such that the flat surface of the solder ball forming plate 10A coincides with a <100> crystallographic plane of the silicon. The cavities 11A are formed in the flat surface, by anisotropic etching, using a mask having square openings and the cavities 11A have the shape of a square pyramid. Solder paste is filled in the cavities 11A, using a squeegee, and the solder ball forming plate 10A is heated to form solder balls 2 in the cavities 11A. The solder ball 2 is shown in FIG. 11. After the solder ball forming plate 10A is arranged relative to the electronic device 50 so that the solder balls 2 are aligned with the electrode pads 51, a reflow step is carried out to transfer the solder balls 2 from the solder ball forming plate 10A to the electrode pads 51 of the electronic device 50. The solder balls 2 get wet to the electrode pads 51 to become solder bumps on the electronic device 50.

Each of the solder balls 2 formed in this manner has a diameter "d" which depends on the volume of solder paste in each cavity 11A, and all the solder balls 2 have a generally identical diameter "d". The diameter "d" is such that the solder ball 2 projects upward a distance from the flat surface (i.e., the <100> crystallographic plane) of the solder ball forming plate 10A, the projecting distance being approximately 10 percent (d/10) of the diameter "d". The solder ball 2 can be transferred to the electrode pad 51 since the solder ball 2 projects upward from the flat surface of the solder ball forming plate 10A. However, the projecting distance is relatively small, so there is a possibility that some of the solder balls 2 may not be transferred to the electrode pads 51.

Figure 12:
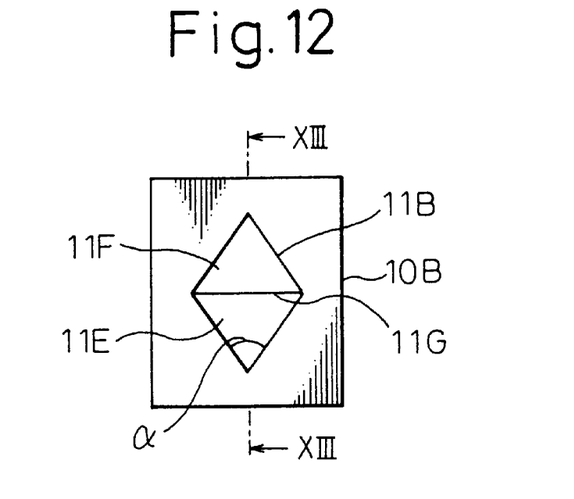
FIG. 12 is a plan view of a solder ball forming plate of another prior art.
Figure 13:
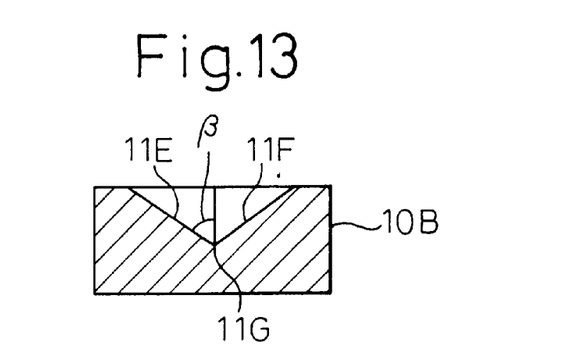
FIG. 13 is a cross-sectional view of the solder ball forming plate of FIG. 12.
Figure 14:
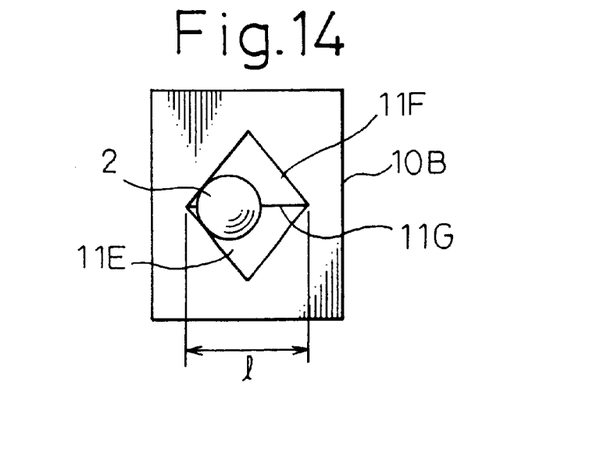
FIG. 14 is a plan view illustrating the solder ball positioned on the deepest portion in the cavity of FIGS. 12 and 14.

FIGS. 12 to 14 of the attached drawings illustrate another solder ball forming plate 10B, having a plurality of cavities 11B (only one is shown in the drawings), which is described in the U.S. patent application Ser. No. 08/547,532 (U.S. Pat. No. 5,643,831). The solder ball forming plate 10B is also made from a silicon wafer such that the flat surface of the solder ball forming plate 10A coincides with a <110> crystallographic plane of the silicon. The cavities 11B are formed in the flat surface, by anisotropic etching, using a mask having rhombic openings. By this etching, each of the cavities 11B is formed in the shape of a ship bottom. That is, each of the cavities 11B has two oblique bottom surfaces 11E and 11F and four side surfaces extending perpendicular to the <110> crystallographic plane, with the oblique bottom surfaces 11E and 11F defining a deepest portion 11G therebetween. The angle α between two adjacent sides of the rhombic opening is 70.53 degrees, and the angle β is 54.74 degrees.

Solder bumps can be fabricated in a manner similar to the previous one. That is, solder paste is filled in the cavities 11B, the solder ball forming plate 10B is heated to form solder balls 2 in the cavities 11A, the solder ball forming plate 10B is arranged relative to the electronic device so that the solder balls 2 are aligned with the electrode pads, and the solder balls 2 are transferred from the solder ball forming plate 10B to the electrode pads of the electronic device, by reflowing. The solder balls 2 become solder bumps on the electronic device.

When the angle α is 70.53 degrees, the depth of the deepest portion 11G is half the length of a shorter diagonal line of the rhombus. Each of the solder balls 2 formed in this manner has a diameter "d" and projects upward a distance from the flat surface (i.e., the <110> crystallographic plane) of the solder ball forming plate 10B, the projecting distance being approximately 20 percent (2d/10) of the diameter "d". Therefore, all the solder balls 2 may be successfully transferred to the electrode pads of the electronic device.

In this case, however, the deepest portion 11G extends parallel to the <110> crystallographic plane, and has a length "l" corresponding to the length of a shorter diagonal line of the rhombus. The length "l" of the deepest portion 11G is longer than the diameter "d" of the solder balls 2, and therefore, the solder balls 2 can move in the respective cavities 11B on the deepest portion 11G. There is a variation of the position of the solder balls 2 in the respective cavities 11B.

In the future, it is expected that, in the ULSIs (ultra LSI), the distance between the adjacent metal bumps become approximately 150 μm and the number of the metal bumps will reach several thousand. In such a case, the metal balls (solder balls) formed in the cavities 11A or 11B should have the diameter in the range from 80 to 90 μm. Therefore, in the case of the solder ball forming plate 10A having the cavities 11A made so that the flat surface coincides with the <100> crystallographic plane, the average projecting distance of the solder balls 2 from the flat surface becomes smaller than 10 μm (10 percent of 80 to 90 μm). If solder paste is not sufficiently filled in the cavities 11A, the projecting distance of the solder balls 2 will be less than this value. Therefore, it is difficult to successfully transfer all the solder balls 2 from the cavities 11A formed in the <100> crystallographic plane to the electrode pads of the electronic device.

On the other hand, in the case of the solder ball forming plate 10B having the cavities 11B made so that the flat surface coincides with the <110> crystallographic plane, the projecting distance of the solder balls 2 from the flat surface is approximately 20 µm. Therefore, regarding the projecting distance of the solder balls 2 from the flat surface, it is easy to successfully transfer all the solder balls 2 from the cavities 11B to the electrode pads of the electronic device. However, the position of the solder balls 2 is not stable in the respective cavities 11B, as described above, so it is difficult to successfully transfer all of several thousand solder balls 2 in the cavities 11B formed by the <110> crystallographic plane to the electrode pads of the electronic device.

In particular, in order to transfer the metal bumps to the electrode pads of the ULSI in which the distance between the adjacent metal bumps is approximately 150 µm and the number of the metal bumps is several thousand without failure, it is important that not only the projecting distance of the metal balls from the flat surface of the solder ball forming plate is relatively greater but also the metal balls are uniformly located in the respective cavities.

SUMMARY OF THE INVENTION

The object of the present invention is to provide a method for fabricating metal bumps onto an electronic device and a plate used for fabricating metal bumps, by which the metal balls can be reliably transferred from the plate to the electronic device.

According to the present invention, there is provided a method for fabricating metal bumps onto an electronic device, said method comprising the steps of: preparing a plate made from a single crystal material having a <110> crystallographic plane, said plate having a flat surface arranged at an angle relative to said <110> crystallographic plane; forming a plurality of cavities in said flat surface of said plate by anisotropic etching; filling the cavities with a paste containing metal particles; heating said plate to form metal balls in the cavities; and transferring the metal balls from said plate to an electronic device to fabricate metal bumps onto said electronic device.

Preferably, each of the cavities has a rhombic opening at said flat surface and two oblique bottom surfaces defining a deepest portion extending parallel to a diagonal line connecting two corners of the rhombus. The deepest portion has a length smaller than a length of the diagonal line connecting two corners of the rhombus.

The single crystal material has a crystalline structure identical to that of a diamond. Preferably, the single crystal material comprises silicon.

The electronic device comprises one of an LSI wafer, a bare chip, a CSP, and a BGA, a TCP.

According to a further aspect of the present invention, there is provided a method for fabricating metal bumps onto an electronic device, said method comprising the steps of: preparing a plate made from a single crystal material having a <110> crystallographic plane, said plate having a flat surface arranged at an angle relative to said <110> crystallographic plane; forming a plurality of cavities on said flat surface of said plate by anisotropic etching; forming a replica based on said plate, said replica having a flat surface and a plurality of cavities on the flat surface thereof; filling the cavities of said replica with a paste containing metal particles; heating said replica to form metal balls in the cavities; and transferring the metal balls from said replica to an electronic device to fabricate metal bumps onto said electronic device.

The present invention also provides a plate used for fabricating metal bumps. The plate is made from a single crystal material having a <110> crystallographic plane. The plate has a flat surface arranged at an angle relative to said <110> crystallographic plane and a plurality of cavities in the flat surface thereof. The cavities are formed in the flat surface by anisotropic etching, each of the cavities having a rhombic opening at the flat surface and two oblique bottom surfaces defining a deepest portion extending parallel to a diagonal line connecting two corners of the rhombus. The deepest portion has a length shorter than that of said diagonal line.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
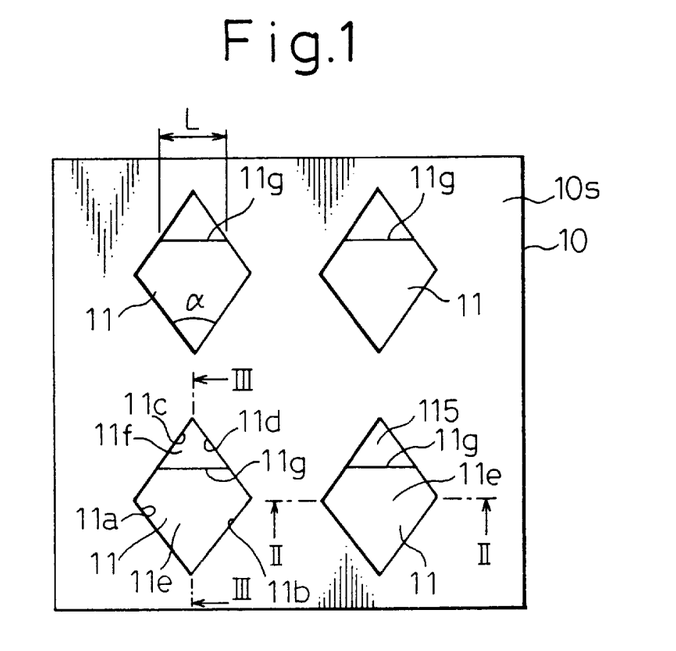
FIG. 1 is a plan view of a solder ball forming plate according to the embodiment of the present invention.
Figure 2:
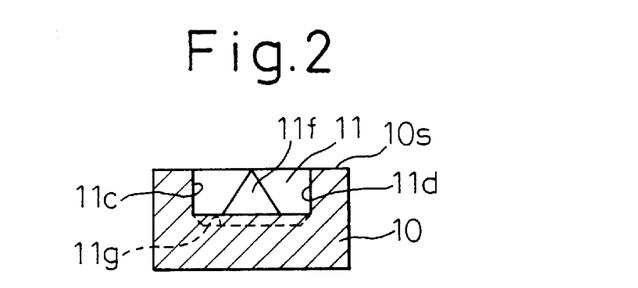
FIG. 2 is a cross-sectional view of the solder ball forming plate of FIG. 1, taken along the line II—II in FIG. 1.
Figure 3:
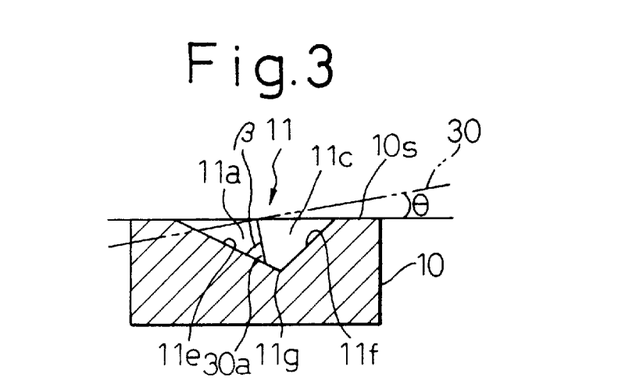
FIG. 3 is a cross-sectional view of the solder ball forming plate of FIG. 1, taken along the line III—III in FIG. 1.

FIGS. 1 to 3 show a solder ball forming plate 10 according to the embodiment of the present invention. The solder ball forming plate 10 has a flat surface 10s and a plurality of cavities 11 formed in the flat surface 10s. The solder ball forming plate 10 is made from a silicon wafer such that the flat surface 10s of the solder ball forming plate 10 is arranged at an angle θ relative to the <110> crystallographic plane 30 of the silicon crystalline structure (see FIG. 3).

Therefore, the flat surface 10s is in a <aab> crystallographic plane. In this case, a≠b, a≠0, and b≠0.

The cavities 11 are formed in the flat surface 10s, by anisotropic etching, using a mask having rhombic openings. By this etching, each of the cavities 11 is formed in the shape of a ship bottom. That is, each of the cavities 11 has four side surfaces 11a to 11d extending perpendicular to the <110> crystallographic plane 30 and two oblique bottom surfaces 11e and 11f. A linear deepest portion 11g is defined at the juncture of the oblique bottom surfaces 11e and 11f. The angle α between two adjacent sides of the rhombic opening is 70.53 degrees, and the angle β between the oblique bottom surface 11e and a (invisible) surface 30a including the X-axis and the Y-axis of the silicon crystal is 54.74 degrees. Each of the oblique bottom surfaces 11e and 11f and the side surfaces 11a to 11d is equivalent to the <111> crystallographic plane, with respect to the atomic density.

When the flat surface 10s of the solder ball forming plate 10, which is the <aab> crystallographic plane arranged at an angle θ relative to the <110> crystallographic plane 30, is anisotropically etched, the deepest portion 11g is formed parallel to the shorter diagonal line of the rhombic opening and displaced toward one of two corners of the rhombus, viewed along the longer diagonal line of the rhombus. That is, the deepest portion 11g is positioned in the cavity 11 near one end thereof.

This can be compared with the deepest portion 11G of FIGS. 12 to 14, in which the deepest portion 11G is formed just below the shorter diagonal line of the rhombic opening. The length "L" of the deepest portion 11g of the cavities 11 according to the present invention is shorter than the length "l" of the deepest portion 11G of the cavities 11A, if the identical mask is used in the present invention and in the case of FIGS. 12 to 14. The length "l" of the deepest portion 11G of the cavities 11 of FIGS. 12 to 14 corresponds to the length of the shorter diagonal line of the rhombic opening of the cavities 11 of FIGS. 1 to 3.

Figure 4A:
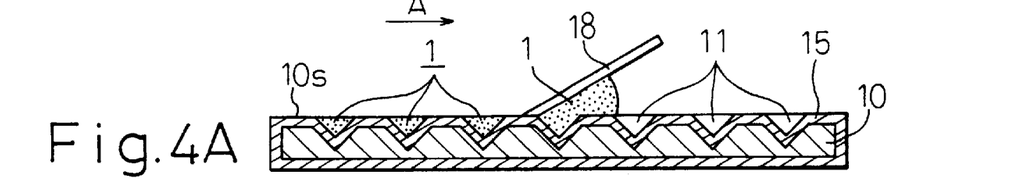
FIGS. 4A to 4E are views illustrating a method for fabricating metal bumps, using the solder ball forming plate of FIGS. 1 to 3.

FIGS. 4A to 4E show a method for fabricating solder bumps (metal bumps) onto an electronic device, using the solder ball forming plate 10. In this example, the solder ball forming plate 10 is prepared in a manner described above, and is coated with a suitable layer 15 such as a chrome layer. The cavities 11 of the solder ball forming plate 10 are filled with a solder paste 1, using a squeegee 18, as shown in FIG. 4A. The volume of all the cavities 12 is uniform, so the amount of the solder paste 1 filled in the cavities 12 is uniform. The solder paste 1 is a mixture of fine solder powders with a flux, a solvent and others.

Figure 4B:
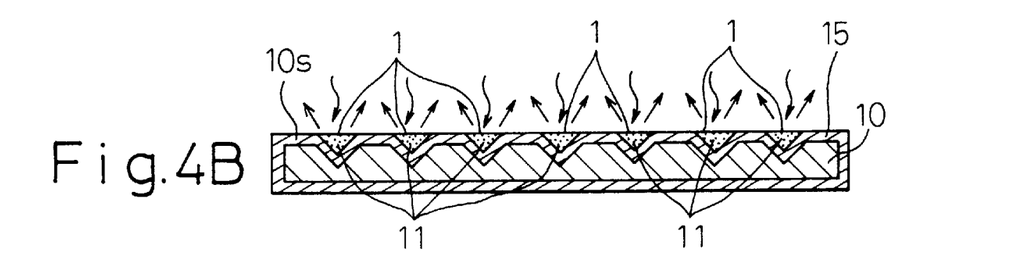
Figure 4C:
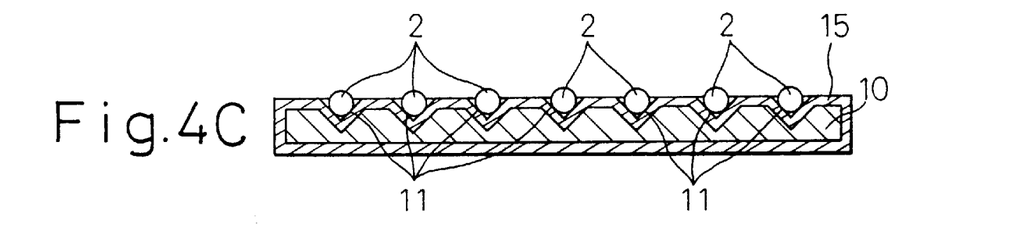

The solder ball forming plate 10 is then heated to a temperature higher than a melting point of the solder in the solder paste 1, and the molten solder particles in each cavity 11 gather into a rounded shape to form a solder ball 2, as shown in FIGS. 4B and 4C. The solvent will evaporate.

Figure 4D:
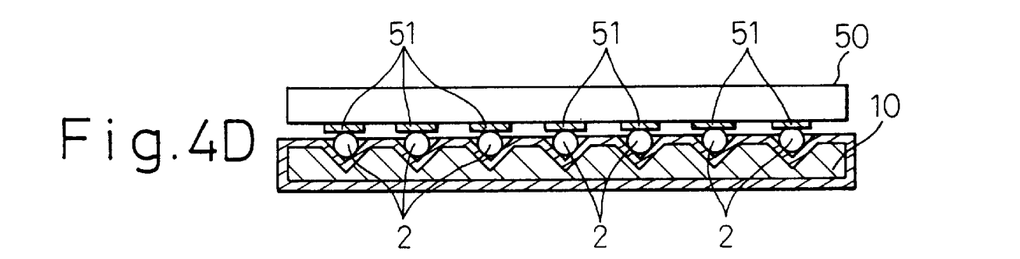

An electronic device 50 having electrode pads 51 is then urged to the solder ball forming plate 10 so that the cavities 11 of the solder ball forming plate 10 coincide with the electrode pads 51 of the electronic device 50, as shown in FIG. 4D. The electronic device 50 is an electronic element which needs metal bumps for the purpose of flip-chip bonding or the like, and comprises, for example, one of an LSI wafer, a chip scale package (CSP), a ball grid array (BGA), and a tape carrier package (TCP). In this case, the bare chip means that it is one cut from the LSI wafer.

Figure 4E:
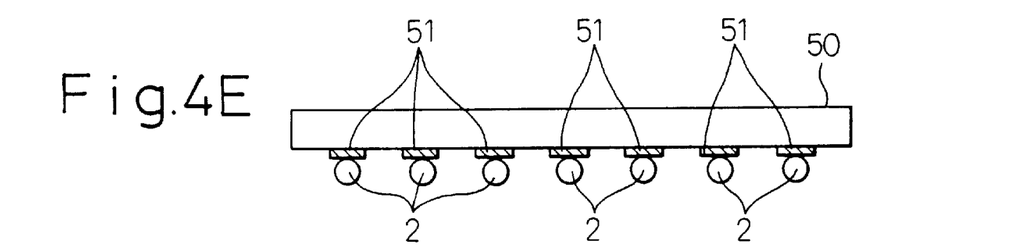

The solder ball forming plate 10 and the electronic device 50 are heated to a temperature higher than a melting point of the solder in the solder paste 1. The solder balls 2 are thus fused and transferred to the electrode pad 51 of the electronic device 50. The electronic device 50 is then removed from the solder ball forming plate 10, with the result that the solder balls 2 become metal bumps on the electronic device 50, as shown in FIG. 4E.

In the preferred embodiment, the <aab> crystallographic plane constituting the flat surface 10s of the solder ball forming plate 10 is the <981 981 100> crystallographic plane, and the angle θ is 10 degrees. The solder ball forming plate 10 is anisotropically etched to form the cavities 11 at the pitch of 150 μm. The length "L" of the deepest portion 11g of the cavities 11 is 63.7 percent of the length "l" of the deepest portion 11G of the cavities 11A.

Figure 5:
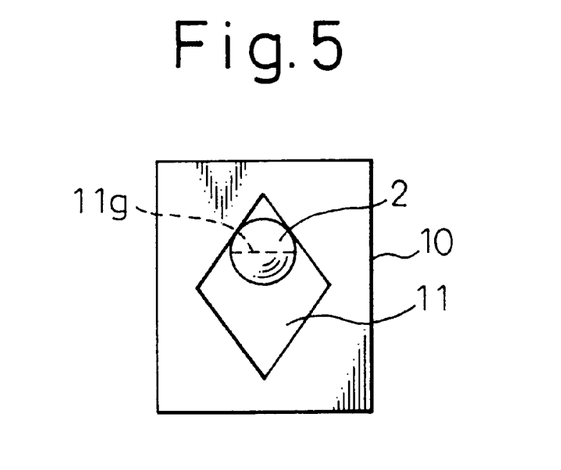
FIG. 5 is a plan view of the solder ball forming plate, illustrating the solder ball positioned in the cavity near one end thereof.
Figure 6:
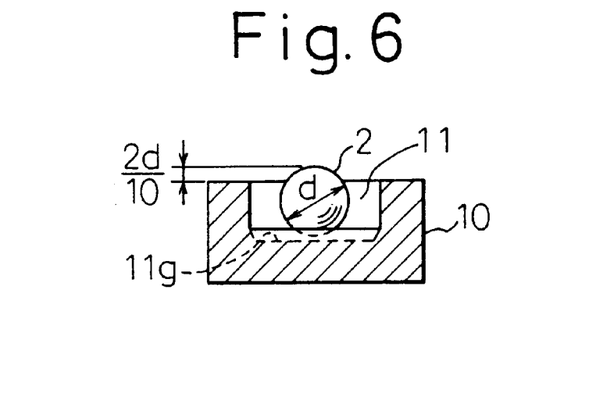
FIG. 6 is a cross-sectional view of the solder ball forming plate and the solder ball of FIG. 5.
Figure 7:
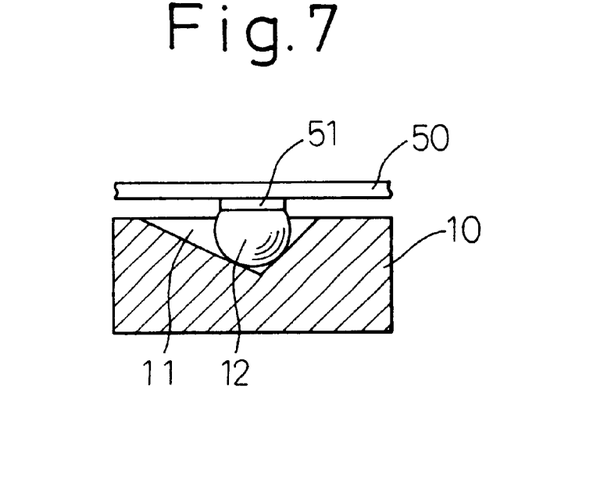
FIG. 7 is a cross-sectional view of the solder ball forming plate and the solder ball when the solder ball is transferred.

FIGS. 5 to 6 show the solder ball forming plate 10 and the solder balls 2 (only one is shown), when the solder balls 2 are formed in the step of FIG. 4C. FIG. 7 shows the step when the solder balls 2 are transferred to the electronic device 50. It will be understood that the difference between the diameter of the solder ball 2 and the length "L" of the cavity 11g becomes smaller due to the reduction of the length "L" of the cavities 11g, compared to the length "l" of the cavities 11G, so that the solder balls 2 are located in the cavities 11 at the respective deepest portions 11g. The solder balls 2 are not allowed to move in the cavities 11 and are thus positioned at constant positions. Therefore, the solder balls 2 can be reliably transferred to the electrode pads 51 of the electronic device 50.

The relationship of the length "L" and the length "l" is expressed as follows.

$$L = \frac{2\tan(54.74 - \theta)}{\tan(54.74 + \theta) + \tan(54.74 - \theta)} l \quad (1)$$

Figure 9:
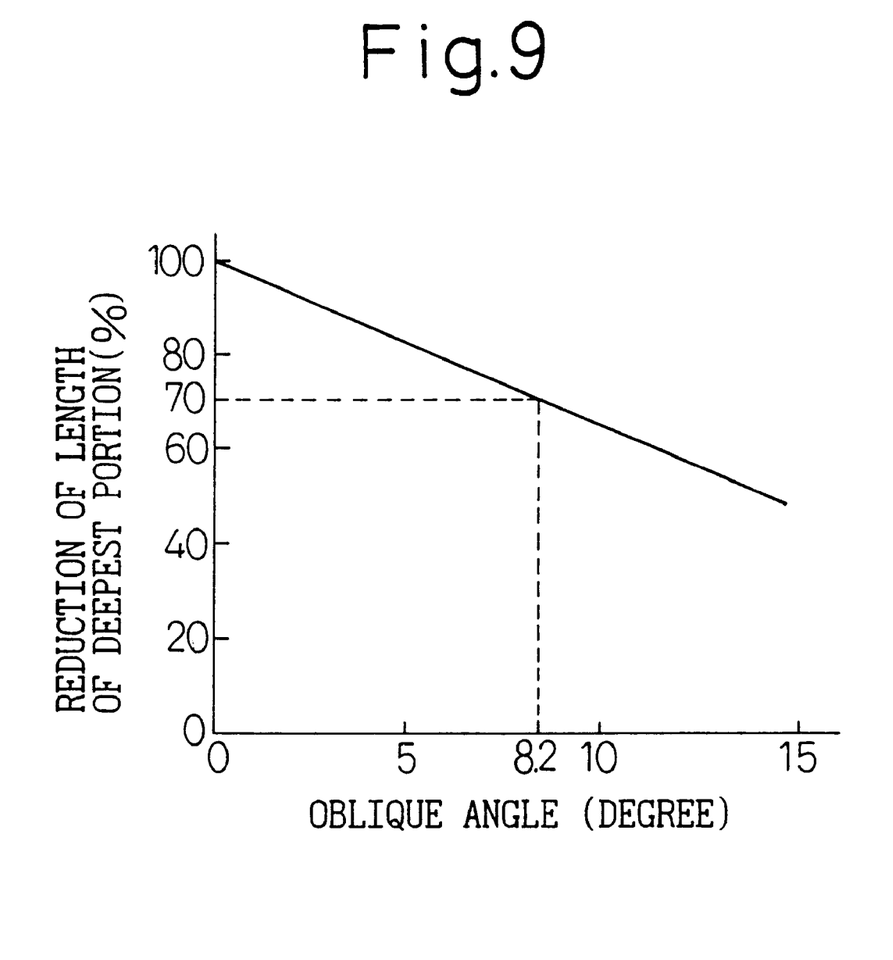
FIG. 9 is a view illustrating the relationship between the reduction of the length of the deepest portion and the oblique angle.

This relationship is also shown in FIG. 9. The reduction of the length "L" of the deepest portion 11g is a ratio of the length "L" relative to the length "l" (L/l). It has been found that a deviation in the position of the solder balls 2 in the cavities becomes smaller if the reduction of the length "L" is lower than approximately 70 percent, and the angle θ is preferably higher than 8.2 degrees.

Figure 8A:
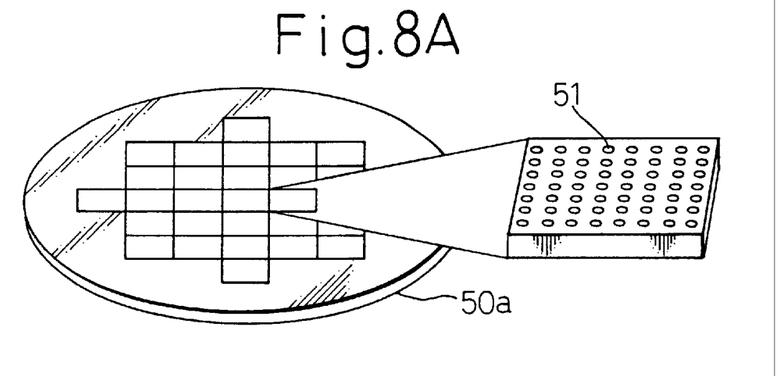
FIGS. 8A to 8E are views of a modified example.
Figure 8B:
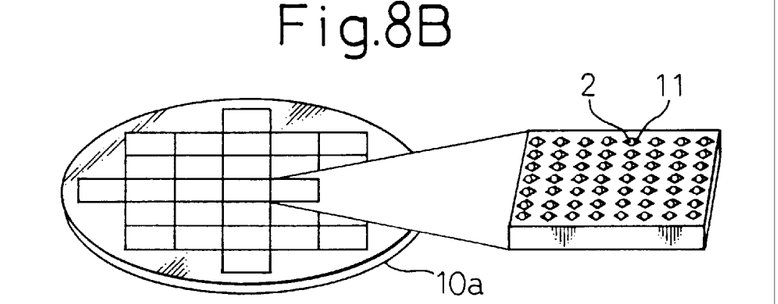

FIGS. 8A to 8E show a modified example of the present invention, in which metal balls 2 are to be formed to an LSI wafer 50a (FIG. 8A). The LSI wafer 50a includes a plurality of chip regions each of which has a plurality of electrode pads 51. The solder ball forming plate is also formed in the form of the silicon wafer 10a (FIG. 8B). The silicon wafer 10a has a plurality of chip regions each of which has a plurality of cavities 11 in which solder balls 2 are formed. The surface of the silicon wafer 10a is the <981 981 100> crystallographic plane.

Figure 8C:
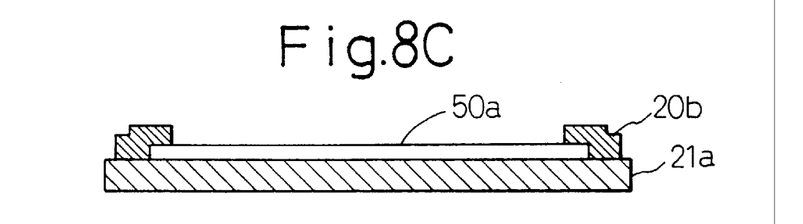
Figure 8D:
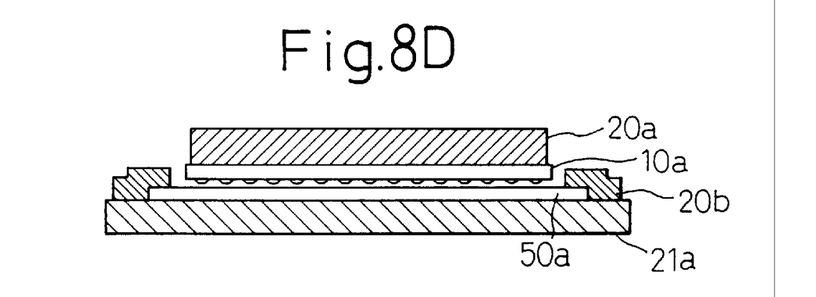
Figure 8E:
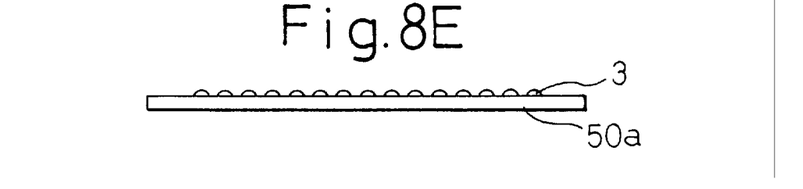

The LSI wafer 50a is supported on a soft magnetic plate (42 alloy, for example) 21a and the periphery of the LSI wafer 50a is held by a hard magnetic member 20b so that any warp in the LSI wafer 50a can be corrected, as shown in FIG. 8C. The silicon wafer 10a is then put on the LSI wafer 50a so that the solder balls 2 coincide with the electrode pads 51, and the assembly of the LSI wafer 50a and the silicon wafer 10a is sandwiched by a hard magnetic member (for example, Sm-Co magnet) 20a and the soft magnetic plate 21a, as shown in FIG. 8D. The assembly is heated to a temperature above the melting point of the solder balls 2 to transfer the solder balls 2. The solder balls 2 are thus transferred from silicon wafer 10a to the LSI wafer 50a, as shown in FIG. 8E. The solder balls 2 become the solder bumps 3 on the LSI wafer 50a.

In the illustrated embodiment, the solder ball forming plate 10 comprises a silicon wafer, but it is possible to make the solder ball forming plate 10 from any other single crystal material which has a crystalline structure identical to that of diamond.

Figure 15A:
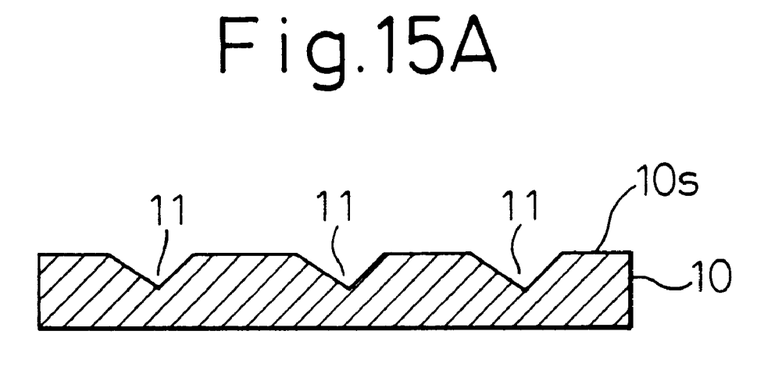
FIGS. 15A to 15C are views illustrating fabrication of a replica of the solder ball forming plate.
Figure 15B:
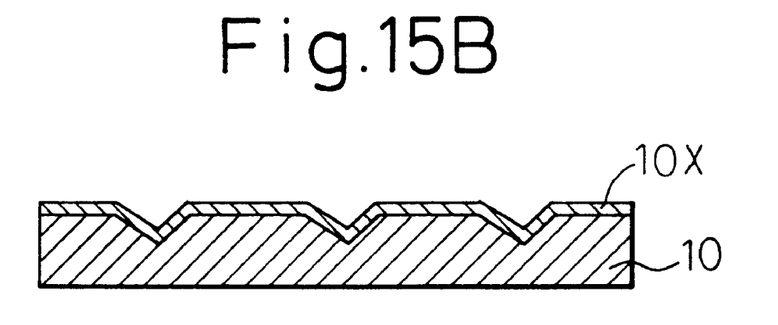
Figure 15C:
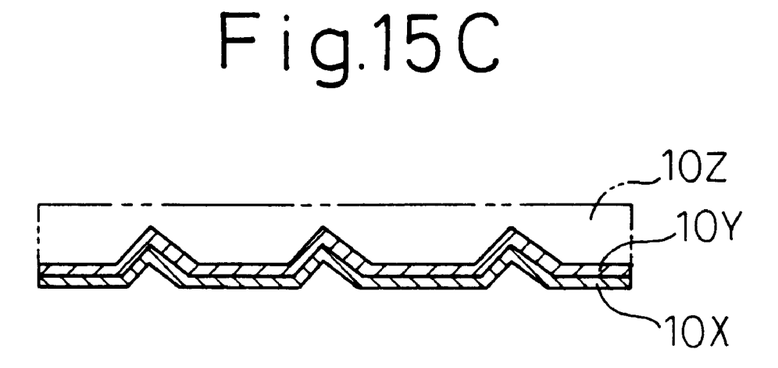

FIGS. 15A to 15C show the fabrication of the replica of the solder ball forming plate 10. FIG. 15A shows the solder ball forming plate 10 made from the silicon wafer in a manner described above. A first replica 10X is fabricated on the solder ball forming plate 10, by electroforming, as shown in FIG. 15B. A second replica 10Y is fabricated on the first replica 10X, by electroforming, as shown in FIG. 15C. Therefore, the second replica 10Y has cavities which correspond to the cavities 11 of the solder ball forming plate 10 or the silicon wafer 10a, so the second replica 10Y can be used as a solder ball forming plate 10.

The first and second replicas 10X and 10Y can be made from metal such as Nickel by which a flexible solder ball forming plate can be obtained. However, the difference between the coefficient of linear expansion of nickel (13.3 ppm/° C.) and that of silicon (3.5 ppm/° C.) is relatively large, so the position of the electrode pads 51 of the electronic device 50 may be displaced relative to the solder balls 2 in the cavities 11 of the solder ball forming plate 10. In this case, it is possible to mitigate the positional displacement by adding an additional supporting layer 10Z to the second replica 10y. The supporting layer 10Z may be made from a material having a coefficient of linear expansion close to that of silicon, such as 42 alloy, and the second replica 10y may be attached to the supporting layer 10Z by a diffused junction.

As described in detail, the present invention uses a plate made from a single crystal material having a <110> crystallographic plane in which the plate has a flat surface (<aab> crystallographic plane) arranged at an angle relative to the <110> crystallographic plane, and cavities are formed in the flat surface by anisotropic etching. The cavities have deepest portions the length of which are reduced compared with that of the cavities formed in the <110> crystallographic plane. Therefore, the metal balls which are formed in the cavities are less apt to move in the cavities and remain at a constant position in the cavities, and the metal balls sufficiently project from the cavities so that all the metal balls can be reliably transferred. Therefore, it is possible to reliably and stably fabricate metal bumps on the electronic device such as an LSI wafer, a bare chip, a CSP, and a BGA.

I claim:

1. A method for fabricating metal bumps onto an electronic device, said method comprising the steps of:

preparing a plate made from a single crystal material having a <110> crystallographic plane, said plate having a flat surface arranged at an angle relative to said <110> crystallographic plane, said angle being greater than zero degrees and smaller than 45 degrees;

forming a plurality of cavities in said flat surface of said plate by anisotropic etching;

filling the cavities with a paste containing metal particles;

heating said plate to form metal balls in the cavities; and transferring the metal balls from said plate to an electronic device to fabricate metal bumps onto said electronic device.

2. A method according to claim 1, wherein each of the cavities has a rhombic opening at said flat surface and two oblique bottom surfaces defining a deepest portion extending parallel to a diagonal line connecting two corners of the rhombus.

3. A method according to claim 2, wherein said deepest portion has a length smaller than a length of the diagonal line connecting two corners of the rhombus.

4. A method according to claim 1, wherein said single crystal material has a crystalline structure identical to that of a diamond.

5. A method according to claim 1, wherein said single crystal material comprises silicon.

6. A method according to claim 1, wherein said electronic device comprises one of an LSI wafer, a bare chip, a CSP, and a BGA, a TCP.

7. A method for fabricating metal bumps onto an electronic device, said method comprising the steps of:

preparing a plate made from a single crystal material having a <110> crystallographic plane, said plate having a flat surface arranged at an angle relative to said <110> crystallographic plane, said angle being greater than zero degrees and smaller than 45 degrees;

forming a plurality of cavities on said flat surface of said plate by anisotropic etching;

forming a replica based on said plate, said replica having a flat surface and a plurality of cavities on the flat surface thereof;

filling the cavities of said replica with a paste containing metal powders;

heating said replica to form metal balls in the cavities; and transferring the metal balls from said replica to an electronic device to fabricate metal bumps onto said electronic device.

8. A plate used for fabricating metal bumps, said plate being made from a single crystal material having a <110> crystallographic plane, said plate having a flat surface arranged at an angle relative to said <110> crystallographic plane and a plurality of cavities in the flat surface thereof, said angle being greater than zero degrees and smaller than 45 degrees, said cavities being formed in said flat surface by anisotropic etching, each of the cavities having a rhombic opening at said flat surface and two oblique bottom surfaces defining a deepest portion extending parallel to a diagonal line connecting two corners of the rhombus, the deepest portion having a length shorter than that of said diagonal line.

9. A plate according to claim 8, wherein said single crystal material has a crystalline structure identical to that of diamond.

10. A method according to claim 1, wherein the angle is greater than zero degrees and smaller than 15 degrees.

11. A method according to claim 7, wherein the angle is greater than zero degrees and smaller than 15 degrees.

12. A plate according to claim 8, wherein the angle is greater than zero degrees and smaller than 15 degrees.

* * * * *